US007019572B2

(12) United States Patent
Miki et al.

(10) Patent No.: US 7,019,572 B2
(45) Date of Patent: Mar. 28, 2006

(54) SYSTEMS AND METHODS FOR INITIALIZING PLLS AND MEASURING VCO CHARACTERISTICS

(75) Inventors: Kazuhiko Miki, Round Rock, TX (US); David W. Boerstler, Round Rock, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/899,370

(22) Filed: Jul. 26, 2004

(65) Prior Publication Data

US 2006/0017477 A1   Jan. 26, 2006

(51) Int. Cl.
*H03L 7/06* (2006.01)
(52) U.S. Cl. .......................................... 327/157; 331/16
(58) Field of Classification Search ................ 327/148, 327/157, 156, 147; 331/17, 16, 25, DIG. 2, 331/1 A; 375/373–376
See application file for complete search history.

(56) References Cited

U.S. PATENT DOCUMENTS

| 5,362,990 | A | * | 11/1994 | Alvarez et al. | ............. | 327/538 |
| 5,512,860 | A | | 4/1996 | Huscroft et al. | ............. | 331/1 A |
| 5,939,949 | A | * | 8/1999 | Olgaard et al. | ............... | 331/17 |
| 5,986,487 | A | * | 11/1999 | Ridgers | ....................... | 327/157 |
| 6,466,069 | B1 | * | 10/2002 | Rozenblit et al. | ........... | 327/157 |
| 6,525,612 | B1 | * | 2/2003 | Aoki | ............................ | 331/11 |
| 6,768,955 | B1 | * | 7/2004 | Gauthier et al. | .............. | 702/75 |

FOREIGN PATENT DOCUMENTS

| JP | H06-61852 | | 3/1994 |
| JP | H11-234124 | | 8/1999 |
| JP | 2000-49598 | | 2/2000 |
| JP | 2001-144609 | | 5/2001 |
| JP | 2002-198811 | | 7/2002 |
| JP | 2003-69423 | | 3/2003 |
| JP | 2003-158452 | * | 5/2003 |

* cited by examiner

*Primary Examiner*—Minh Nguyen
(74) *Attorney, Agent, or Firm*—Law Offices of Mark L. Berrier

(57) ABSTRACT

Systems and methods for measuring the characteristics of voltage controlled oscillators within these circuits and initializing the circuits without coupling circuitry to the voltage control node that could introduce noise at this node. One embodiment includes a PLL circuit having a charge pump and control circuitry for driving the charge pump, where the control circuitry is configured to provide "up" and "down" signals to the charge pump in a normal operational mode or a test/initialization mode. In the normal mode, the control circuitry passes signals received from a phase frequency detector through to the charge pump as the up and down signals. In the test/initialization mode, the control circuitry overrides at least one of the signals received from the phase frequency detector to drive the charge pump to generate a selectable test voltage which is used by a voltage controlled oscillator to generate an output signal at a corresponding frequency.

19 Claims, 7 Drawing Sheets

SYSTEMS AND METHODS FOR INITIALIZING PLLS AND MEASURING VCO CHARACTERISTICS

BACKGROUND

1. Field of the Invention

The invention relates generally to phase locked loop circuits, and more particularly to systems and methods for initializing these circuits and measuring the characteristics of voltage controlled oscillators within the circuits.

2. Related Art

A phase-locked loop circuit, or PLL, is electronic circuit that is designed to control an oscillator to produce a signal that is locked onto a reference signal. In other words, the signal produced by the oscillator is kept in phase with the reference signal. The oscillator signal may have the same frequency as that reference signal, or it may be a multiple or fraction of the reference signal.

Referring to FIG. 1, the structure of an exemplary circuit in accordance with the prior art is shown. PLL circuit 100 includes a phase frequency detector 110, a charge pump 120, a voltage controlled oscillator 130, a divider 140 and a capacitor 150. PLL circuit 100 receives a reference clock signal, REF_CLK, and generates an output signal, PLL_OUT, which in this case is also a clock signal. The frequency of PLL_OUT is a multiple of REF_CLK, as determined by divider 140. This will be explained more detail below.

It can be seen from FIG. 1 that phase frequency detector 110 receives the reference clock signal, REF_CLK, as well as a feedback clock signal, FB_CLK. Phase frequency detector 110 compares these two signals and determines whether the frequency of the feedback clock signal is higher or lower than the reference clock signal. If the frequency of the feedback clock signal is higher than the frequency of the reference clock signal, phase frequency detector 110 asserts a "down" signal, DN. If, on the other hand, the frequency of the feedback clock signal is lower than the frequency of the reference clock signal, phase frequency detector 110 asserts a "up" signal, UP.

The UP and DN signals generated by phase frequency detector 110 are provided to charge pump 120. These signals are used by charge pump 120 to control a current source and a current drain within the charge pump. If the UP signal is asserted, charge pump 120 couples the current source to its output. If the DN signal is asserted, charge pump 120 couples the current drain to its output. Thus, depending upon whether UP or DN is asserted, the output of charge pump 120 effectively acts as a current source or a current drain.

The output of charge pump 120 is coupled to the input of voltage controlled oscillator 130. The connection between charge pump 120 and voltage controlled oscillator 130 is a node that is sometimes referred to as the voltage control node (VC). This node is called the voltage control node because it is the voltage at this node that controls the frequency of the oscillations produced by voltage controlled oscillator 130. By alternately coupling the voltage control node to a current source or a current drain, the charge (and corresponding voltage) at the node can be controlled, thereby controlling the frequency of oscillations produced by voltage controlled oscillator 130 (i.e., the output of PLL circuit 100.)

Because the frequency of voltage controlled oscillator 130 is dependent upon the voltage at the voltage control node, PLL circuit 100 is typically very sensitive to changes in the voltage at this node. The voltage control node is therefore coupled to ground through capacitor 150. This serves to shunt oscillations in the voltage at the node (particularly high frequencies) to ground, stabilizing the voltage at the node. This, in turn, stabilizes the frequency of oscillations produced by voltage controlled oscillator 130.

While the design of PLL circuit 100 is adequate for some implementations, it would be helpful to provide additional features that would make the PLL more useful. For example, it is generally useful to have a characterization of the PLL. In other words, it is useful to know the correspondence between the voltage at the voltage control node and the frequency of the output signal. This process, while straightforward, can be very time-consuming in a laboratory environment. In a manufacturing environment, the difficulty of characterizing the PLL can be prohibitive. As an alternative to characterizing the entire PLL, it may be useful to simply determine the frequency-versus-voltage characteristics of the voltage controlled oscillator. This information can provide an alternative means for determining whether the PLL circuit will operate properly through the range of possible voltages/frequencies.

Conventionally, however, this information is obtained by coupling circuitry to the voltage control node to control the voltage at the node. This voltage can then be varied (e.g., stepped) across a range of voltages, and the corresponding frequencies produced by the voltage controlled oscillator can be measured. This data can then be plotted to show the frequency-versus-voltage characteristics of the voltage controlled oscillator. One of the problems with this approach, however, is that the additional circuitry creates noise at the voltage control node and thereby degrades the performance of the PLL circuit.

Another desirable feature relates to the initialization of the PLL circuit. When the circuit is powered on, the voltage at the voltage control node is unknown. The voltage may be anywhere between a minimum voltage (e.g., ground) to a maximum voltage (e.g., Vdd.) This can be a problem because, if the voltage is at its maximum value, the signal generated by voltage controlled oscillator 130 will be at its maximum frequency. The components of PLL circuit 100 must therefore be designed to operate correctly, even if the voltage at the voltage control node and the frequency of the signal produced by voltage controlled oscillator 130 are at their maximum values. Otherwise, PLL circuit 100 may not lock (i.e., it may malfunction.) Because it is generally more difficult to design high-performance components, such as divider 140, to handle the higher voltages and frequencies, this may increase the difficulty, complexity and/or cost of designing the components and the circuit.

Conventional PLL circuit designs sometimes include a mechanism coupled to the voltage control node to pull down the voltage at the node when the circuit is initialized. For example, in some conventional designs, the voltage control node is coupled to ground through a transistor that is switched on and off by an initialization signal. When the circuit is being initialized, the transistor is switched on to couple the voltage control node to ground and thereby pull down the voltage. After the circuit is initialized, the transistor is switched off to decouple the voltage control node from ground. While this mechanism is effective to prevent the circuit from initializing at a high-frequency, it also has the disadvantage of introducing noise at the voltage control node.

It would therefore be desirable to provide systems and/or methods for providing these features without the disadvantages that are inherent in the conventional means for providing these features.

SUMMARY OF THE INVENTION

One or more of the problems outlined above may be solved by the various embodiments of the invention. Broadly speaking, the invention comprises systems and methods for measuring the characteristics of voltage controlled oscillators within these circuits and initializing the circuits without coupling circuitry to the voltage control node that could introduce noise at this node.

One embodiment comprises a system implemented in a phase-locked loop (PLL) circuit. The system includes a charge pump and control circuitry configured to drive the charge pump. The control circuitry is configured to provide "up" and "down" signals to the charge pump in either a first mode, which is a normal operational mode, or a second mode, which can be either a test mode or an initialization mode. In the first mode, the control circuitry passes signals received from a phase frequency detector through to the charge pump as the up and down signals. In the second mode, the control circuitry overrides at least one of the signals received from the phase frequency detector to drive the charge pump to generate a selectable test voltage at its output. This voltage is used by a voltage controlled oscillator to generate an output signal at a corresponding frequency.

The control circuitry operates based upon a set of control inputs. In one embodiment, the control inputs include an up control signal and a down control signal. If the up control signal is asserted, the up signal to the charge pump is asserted to switch on a corresponding current source transistor. If the down control signal is asserted, the down signal to the charge pump is asserted to switch on a corresponding current drain transistor. The control circuitry thereby drives the charge pump to generate a minimum, a maximum or a mid-range voltage at its output. In one embodiment, separate test and initialization control inputs are provided to the control circuitry. In another embodiment, multiple sets of control logic are implemented in the control circuitry to drive parallel current source transistors and parallel current drain transistors and to thereby generate multiple intermediate voltages at the output of the charge pump in addition to the minimum and maximum voltages.

Another embodiment comprises a method for operating a PLL circuit. The method includes operating in a first mode (a normal operational mode) in which up and down signals are provided to a charge pump of the PLL circuit, where the up and down signals are passed from a phase frequency detector to a charge pump to drive a voltage at an output of the charge pump to a voltage that produces a phase-locked signal at the output of a voltage controlled oscillator. The method also includes operating in a second mode (a test or initialization mode) in which at least one of the up and down signals is overridden to drive the voltage at the output of the charge pump to a selectable test voltage. In the test mode, the selected voltage may be a minimum, a maximum, or an intermediate voltage. In the initialization mode, the voltage is driven to a value below Vdd, which is typically the minimum value but may alternatively be an intermediate value.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
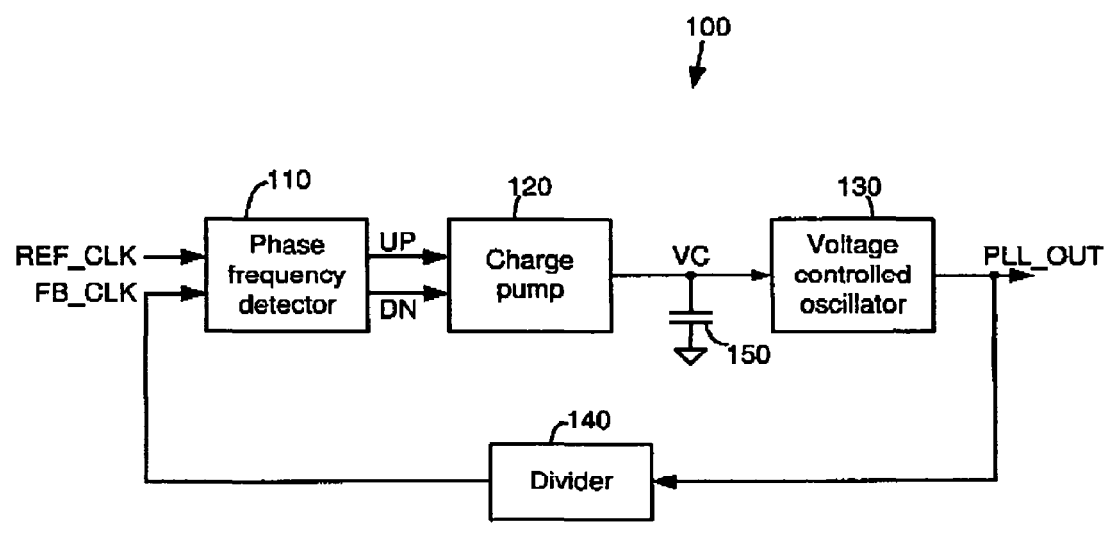
FIG. 1 is a diagram illustrating the structure of an exemplary PLL circuit in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for controlling the charge pump within a PLL circuit in order to control the voltage at a voltage control node at the input of the PLL circuit's voltage controlled oscillator. These systems and methods may be used to enable both the measurement of the characteristics of the voltage controlled oscillator and the initialization of the PLL circuit in a controlled manner.

In one embodiment, a PLL circuit includes a phase frequency detector, a charge pump, a voltage controlled oscillator and a divider that are essentially as described above in connection with FIG. 1. The PLL circuit of this embodiment, however, includes control circuitry coupled between the phase frequency detector and the charge pump. This control circuitry allows the PLL circuit to function in either a normal operational mode or a test mode.

When the PLL circuit functions in the normal operational mode, the control circuitry is transparent, and the PLL circuit operates as if the control circuitry were not present. In the test mode, the control circuitry serves to override the signals that are normally provided by the phase frequency detector to the charge pump, and to instead provide signals to the charge pump that drive the voltage at the voltage control node to one or more selectable voltages. These voltages may include a minimum voltage (e.g., ground,) a maximum voltage (e.g., Vdd,) and one or more voltages intermediate to the minimum and maximum voltages.

In one embodiment, the control circuitry is configured to receive a pair of control inputs, UP_CTRL and DN_CTRL. When both of these control inputs are low, the PLL circuit operates in the normal operational mode. When one or both of these control inputs are high, the PLL circuit operates in the test mode. In the test mode, each control input overrides a corresponding one of the signals that are normally provided by the case frequency detector to the charge pump (i.e., UP and DN.) Thus, the control circuitry can keep the UP signal asserted to drive the voltage at the output of the charge pump to its maximum value, thereby driving the output of the voltage controlled oscillator to its maximum frequency. Alternatively, the control circuitry can keep the DN signal asserted to drive the voltage at the output of the charge pump to its minimum value, thereby driving output of the voltage controlled oscillator to its minimum frequency. As another alternative, the control circuitry can assert both the UP and DN signals at the same time, driving the voltage at the output of the charge pump to an intermediate value, thereby driving output of the voltage controlled oscillator to a corresponding intermediate frequency. In this manner, three points in the frequency response of the voltage controlled oscillator can be determined.

In one embodiment, that control circuitry is configured to receive an initialization control input. When the PLL circuit is initialized (e.g., in a power-on reset,) this control input is high. This causes the control circuitry to assert the DN signal to the charge pump, while keeping the UP signal low. This drives down the voltage at the voltage control node to its minimum value. The voltage controlled oscillator therefore generates an output signal that has a minimum frequency. Because the voltage controlled oscillator initially generates a minimum in from frequency signal, rather than a potentially maximum-frequency signal, the difficulty of designing the components of the PLL circuit is reduced. As noted above, the voltage at the voltage control node may be driven to an intermediate value in other embodiments.

Figure 2:
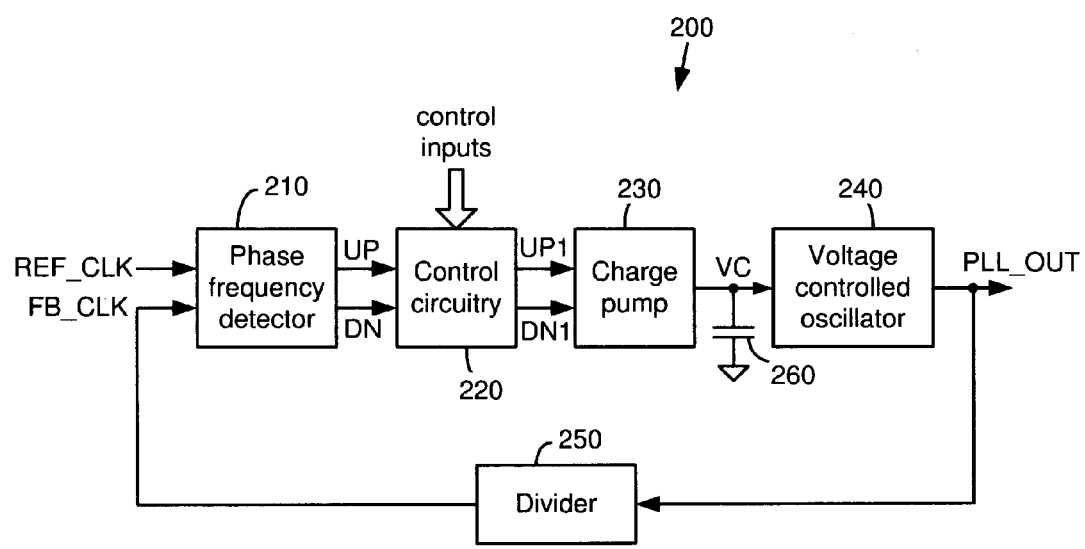
FIG. 2 is a diagram illustrating the structure of a PLL circuit in accordance with one embodiment of the invention.

A PLL circuit in accordance with an exemplary embodiment of the invention is illustrated in FIG. 2. In this embodiment, PLL circuit 200 includes a phase frequency detector 210, a charge pump 230, a voltage controlled oscillator 240, a divider 250 and a capacitor 260, similar to PLL circuit 100 shown in FIG. 1. In the embodiment of FIG. 2, however, includes control circuitry 220. Control circuitry 220 is positioned between phase frequency detector 210 and charge pump 230.

Control circuitry 220 is configured to receive the UP and DN signals generated by phase frequency detector 210, as well as a set of control inputs. Based upon these inputs signals, control circuitry 220 generates a new set of signals, UP1 and DN1, that are provided to charge pump 230 in place of the UP and DN signals generated by phase frequency detector 210. Depending upon the control inputs, new signals UP1 and DN1 may be the same as UP and DN, respectively, or they may be different.

The control inputs to control circuitry 220 correspond to two different modes of operation. One of these modes is a normal operational mode. In this mode, the UP and DN signals received from phase frequency detector 210 are essentially passed through control circuitry 220 and provided to charge pump 230 as signals UP1 and DN1. (It should be noted that signal UP is inverted before being provided to charge pump 230 as UP1, as will be explained in more detail below.) In this instance, control circuitry 220 is effectively transparent to the adjoining components. In other words, charge pump 230 is controlled by the two signals that are generated by phase frequency detector 210, and PLL circuit 200 operates as if control circuitry 220 were not present.

The other mode in which PLL circuit 200 may operate is a test mode. In the test mode, the UP and DN signals generated by phase frequency detector 210 are overridden by control circuitry 220. These signals are effectively replaced by two new signals (UP1 and DN1) that are configured to cause charge pump 230 to drive the voltage at the voltage control node to a test voltage. This test voltage is selectable from a set of possible test voltages. For example, a maximum voltage (e.g., Vdd) may be selected as the test voltage. This maximum voltage at the voltage control node will cause voltage controlled oscillator 240 to oscillate at a corresponding maximum frequency. The test voltage can alternatively be selected to be a minimum possible voltage at the voltage control node (e.g., ground), or some intermediate voltage between the minimum and maximum voltages. Selection of the minimum or intermediate voltages will cause voltage controlled oscillator 240 to oscillate at a minimum or intermediate frequency, respectively.

It should be noted that the voltage at the voltage control node corresponds to the charge on capacitor 260 (where Q=CV). The voltage control node may therefore be alternately described as having an associated charge or voltage. Discussion of the voltage control node may therefore reference the charge on the capacitor when the discussion is related to the charge pump, and may reference the voltage at the capacitor when the discussion is related to the voltage controlled oscillator.

It should also be noted that the test voltages are distinct from the steady-state voltage at which the output of PLL circuit 200 is phase-locked with the reference clock signal. This steady-state voltage is not selected directly, but is effectively found through trial and error. In other words, the voltage at the voltage control node has some initial value that causes voltage controlled oscillator 240 to generate an output signal, PLL_OUT, having a corresponding frequency. If this frequency is higher than desired, the voltage at the voltage control node is reduced. If the frequency is lower than desired, the voltage is increased. Through this iterative process, the voltage at the voltage control node arrives at what ever voltage is necessary to cause voltage controlled oscillator 240 to generate the output signal at the desired frequency. Thus, in a sense, the frequency of the output signal drives the voltage at the voltage control node.

The test voltages, on the other hand, are not driven by the output of PLL circuit 200. The test voltages are selected from the range of possible voltages, and then the output signal, PLL_OUT, is measured to determine the relationship between the test voltage at the voltage control node and the output signal frequency. It should be noted that the test voltages do not need to take on specific, predetermined values in this embodiment. The purpose of selecting the test voltages is to provide some information relating to the characterization of voltage controlled oscillator 240. It is therefore sufficient in this embodiment to know that the voltage at the voltage control node will be selectably driven to a maximum value (approximately Vdd,) a minimum value (approximately ground) or an intermediate, mid-range value (approximately Vdd/2.)

Figure 3:
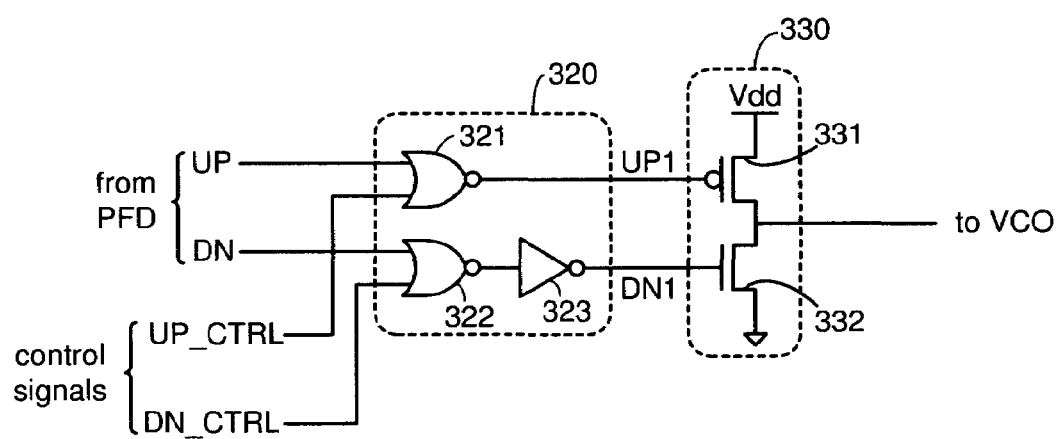
FIG. 3 is a diagram illustrating the structure of control circuitry and a charge pump for a PLL circuit in accordance with one embodiment.

Referring to FIG. 3, a diagram illustrating the structure of control circuitry 320 and charge pump 330 in accordance with one embodiment is shown. Control circuitry 320 and charge pump 330 are examples of the types of components that can be used in PLL circuit 200 (i.e., control circuitry 320 is exemplary of control circuitry 220 and charge pump 330 is exemplary of charge pump 230.)

In this embodiment, charge pump 330 consists of two transistors, 331 and 332. The source of transistor 331 is coupled to a voltage source at Vdd. The drain of transistor 331 is coupled to the source of transistor 332. The drain of transistor 332 is coupled to ground. The output of charge pump 330 is connected to the node between transistors 331 and 332 (i.e., it is connected to the drain of transistor 331 and the source of transistor 332.) Transistor 331 therefore switchably couples the output of charge pump 330 to a current source. That is, transistor 331 switches on and off to alternately couple and decouple the output of charge pump 330 to the current source. Transistor 332, on the other hand, switchably couples the output to a current drain. The gates of transistors 331 and 332 are connected to the respective inputs of charge pump 330. Signal UP1 is applied to the gate of transistor 331, while signal DN1 is applied to the gate of transistor 332.

In operation, transistors 331 and 332 are switched on and off to increase or decrease the charge on the capacitor coupling the voltage control node to ground, thereby increasing or decreasing the voltage that controls the frequency of the signal produced by the voltage controlled oscillator. Typically, transistors 331 and 332 are switched on in pulses. In other words, when it is necessary to increase or decrease the charge on the capacitor, the appropriate one of the transistors is switched on for a certain interval, and then is switched off.

Referring again to FIG. 3, it can be seen that charge pump 330 receives signals UP1 and DN1 from control circuitry 320. Control circuitry 320 generates signals UP1 and DN1 based on UP and DN signals received from the phase frequency detector and two additional control signals, UP_CTRL and DN_CTRL. Control circuitry 320 includes two NOR gates, 321 and 322, and an inverter 323. NOR gate 321 receives phase frequency detector signal UP and control signal UP_CTRL as inputs. The output of NOR gate 321 is provided to charge pump 330 as signal UP1. NOR gate 322 receives phase frequency detector signal DN and control signal DN_CTRL as inputs. The output of NOR gate 322 is then input to inverter 323. The output of inverter 323 is then provided to charge pump 330 as signal DN1.

Control circuitry 320 operates as follows. If both of the control signals, UP_CTRL and DN_CTRL, are low, the PLL circuit functions in the normal operational mode. That is, the UP and DN signals are passed through to charge pump 330 as signals UP1 and DN1, where DN1 is the same as DN, and UP1 is the inverse of UP. If either of the control signals is high, the PLL circuit operates in the test mode. Depending upon which of these signals is high and which (if any) is low, charge pump 330 may be caused to drive the charge/voltage at the voltage control node to a minimum, maximum or intermediate value.

It should be noted that "passed through," as used herein, refers to the assertion of the UP1 and DN1 signals when the UP and DN signals, respectively, are asserted. When the UP and DN (hence UP1 and DN1) signals are asserted, the current source and current drain transistors, respectively, are switched on. In the embodiments described in detail in this disclosure, the UP and DN signals are asserted when they are high and deasserted when they are low. Because the charge pumps in these embodiments consist of a PMOS current source transistor (which is switched on by a low signal at its gate) and an NMOS current drain transistor (which is switched on by a high signal at its gate,) UP1 is low when asserted and DN1 is high when asserted. In other embodiments, the states (high/low) of the signals when they are asserted may vary.

It should be noted that the phase frequency detector asserts signal UP to increase the charge/voltage at the voltage control node, and asserts signal DN to decrease the charge/voltage at the voltage control node. In this embodiment, the phase frequency detector "asserts" each of these signals by generating a pulse that goes from low to high, then back to low. In normal operation, control circuitry 320 inverts signal UP, but does not invert signal DN, before presenting these signals to charge pump 330 as UP1 and DN1, respectively. The inversion of signal UP is necessary because transistor 331 is a PMOS transistor that is switched on when the signal applied to its gate (UP1) goes low, and switched off when the signal goes high. Transistor 332, the other hand, is an NMOS transistor that is switched on when the signal applied to its gate (DN1) goes high, and switched off when the signal goes low, so no inversion of DN is necessary.

The phase frequency detector generates the UP and DN signals based on a comparison of the reference and feedback signals. When the phase frequency detector detects that the rising edge of the FB_CLK signal is later than the rising edge of the REF_CLK signal, it generates a pulse in the UP signal. As a result, in the normal operational mode, transistor 331 is switched on for a short interval, allowing current to flow from the voltage source to the voltage control node and adding some amount of charge to the voltage control node capacitor. When the phase frequency detector detects that the rising edge of the FB_CLK signal is earlier than the rising edge of the REF_CLK signal, it generates a pulse in the DN signal. In the normal operational mode, this causes transistor 332 to be switched on for a short interval. In this case, current flows from the voltage control node to ground and reduces the charge on the voltage control node capacitor by some amount. The UP and DN signals generated by the phase frequency detector thereby incrementally increase or decrease the charge/voltage at the voltage control node in normal operation until the feedback clock signal matches the reference clock signal.

As described above, control circuitry 320 is effectively transparent when the PLL circuit functions in the normal operational mode. In this mode, the phase frequency detector generates UP and DN signals that are passed through control circuitry 320 to charge pump 330, driving the voltage at the voltage control node to a level at which the output of the voltage controlled oscillator is phase-locked. When the PLL circuit operates in the test mode, the phase frequency detector continues to generate signals UP and DN as described above. Control circuitry 320, however, overrides one or both of these signals so that the PLL circuit generates an output signal having a frequency other than the frequency at which it is locked with the reference signal. The PLL circuit can thereby be driven to a selectable test voltage.

As noted above, the PLL circuit operates in the test mode when one or both of control signals UP_CTRL and DN_CTRL is high. If UP_CTRL is low and DN_CTRL is high, control circuitry 320 asserts DN_CTRL, causing charge pump 330 to drive the charge/voltage at the voltage control node to a level that is near the minimum possible value. If UP_CTRL is high and DN_CTRL is low, control circuitry 320 asserts UP_CTRL, causing charge pump 330 to drive the charge/voltage at the voltage control node to a level that is near the maximum possible value. If both UP_CTRL and DN_CTRL are high, control circuitry 320 asserts both UP_CTRL and DN_CTRL, causing charge pump 330 to drive the charge/voltage at the voltage control node to an intermediate level that is approximately halfway between the minimum and maximum values. The voltage controlled oscillator, of course, generates an output signal at a minimum, maximum or intermediate frequency corresponding to the selected voltage control node charge/voltage. The output signal frequency as a function of the control signal values is summarized in the truth table below.

| UP_CTRL | DN_CTRL | Voltage at VC |
|---------|---------|---------------|
| 0 | 0 | Normal |
| 0 | 1 | Minimum (ground) |
| 1 | 0 | Maximum (Vdd) |
| 1 | 1 | Vdd/2 |

Figure 4:
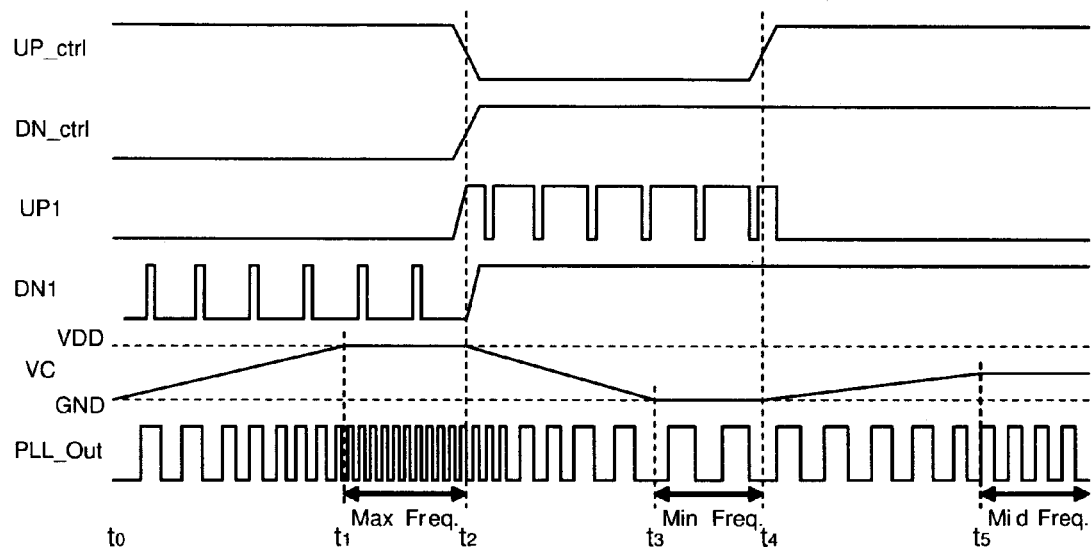
FIG. 4 is a diagram illustrating the signals at various points within the PLL circuit of FIG. 3 as a function of time.

The operation of the PLL circuit and the test mode are described below with reference to FIG. 4. FIG. 4 is a diagram illustrating the signals at various points within the PLL circuit as a function of time. The signals illustrated in the figure include control signals UP_CTRL and DN_CTRL, charge pump input signals UP1 and DN1, the voltage (VC) at the voltage control node, and the output signal, PLL_OUT, produced by the voltage controlled oscillator.

Referring to the left side of FIG. 4, signal UP_CTRL is high and signal DN_CTRL is low, corresponding to line three of the truth table above. Since UP_CTRL is high, the output of NOR gate 321 (i.e., UP1) is low. UP_CTRL remains high, so UP1 remains low, even though the phase frequency detector may generate one or more pulses in the UP signal. Since DN_CTRL is low, the outputs of NOR gate 322 and inverter 323 depend upon signal DN, which is received from the phase frequency detector. Because the charge/voltage at the voltage control node is driven up in this situation, the voltage controlled oscillator will most likely generate an output signal at a frequency that is higher than the frequency at which it will be locked. Consequently, the phase frequency detector will detect the difference in the phases of the feedback and reference signals (the rising edge of FB_CLK will be earlier than that of REFERENCE_CLK,) and will generate a series of pulses in signal DN to try to drive the charge/voltage at the voltage control node back to a level at which output signal PLL_OUT will be phase-locked.

Because signal UP1 remains low, the output of charge pump 330 remains coupled to the current source. Because signal DN1 contains a series of pulses, the output of charge pump 330 is periodically coupled to the current drain. The constant state of signal UP1 dominates the pulses of DN1, so the charge/voltage at the voltage control node is driven up to a level that is near the maximum value (Vdd in this embodiment.) The pulses of DN1, however, may prevent the voltage level from actually reaching the maximum value. As depicted in FIG. 4, the voltage at the voltage control node is initially near ground, then increases until it reaches a maximum near Vdd at time t1. As long as UP_CTRL is high, the voltage at the voltage control node remains near the maximum value. It can be seen that the frequency of the output signal, PLL_OUT, follows the voltage level at the voltage control node, increasing from time to t0 time t1, and then remaining at a maximum frequency from t1 to t2.

At time t2, control signals UP_CTRL and DN_CTRL are reversed, so that UP_CTRL is low and DN_CTRL is high. This corresponds to line 2 of the truth table above. Because DN_CTRL is high, the output of NOR gate 322 is low. The output of this gate remains low, regardless of whether signal DN is high or low. Since the output of NOR gate 322 (which is input to inverter 323) remains low, the output of inverter 323 (DN1) remains high. Consequently, transistor 332 will remain switched on, coupling the output of charge pump 330 to the current drain.

Because UP_CTRL is low, the output of NOR gate 321 is dependent upon the UP signal received from the phase frequency detector. Specifically, the output of NOR gate 321 (UP1) is the inverse of the UP signal. Because, in this situation, the voltage level at the voltage control node will be driven down, it is likely that the phase frequency detector will determine that there is a phase difference between the feedback and reference signals (the rising edge of FB_CLK will be later than that of REFERENCE_CLK) and will generate a series of pulses in the UP signal. The corresponding pulses in the UP1 signal will periodically switch transistor 331 on and off, coupling and decoupling the output of charge pump 330 to the current source.

Because transistor 332 remains switched on and transistor 331 is switched on only periodically, charge pump 330 will act as a current drain. The charge/voltage at the voltage control note will therefore be pulled down to a minimum value. In this embodiment, the minimum value will be near ground, but may not actually reach ground because of the periodic pulses in the UP1 signal that couple the output of charge pump 330 to the current source. Thus, it can be seen that the charge/voltage at the voltage control node, which is near Vdd when the control signals are switched (at time t2,) begins to decrease and then reaches a minimum at approximately time t3. As long as control signals UP_CTRL and DN_CTRL remain low and high, respectively, the charge/voltage at the voltage control node will remain at a minimum level. It can be seen that the frequency of output signal PLL_OUT decreases from a maximum frequency at time t2 to a minimum frequency at time t3, and then remains at the minimum frequency until the control signals are switched at time t4.

At time t4, control signals UP_CTRL and DN_CTRL both go high. Because UP_CTRL is high, the output of NOR gate 321 is low. This signal (UP1) remains low, regardless of changes in phase frequency detector signal UP. Similarly, because DN_CTRL is high, the output of NOR gate 322 is low. This signal remains low, regardless of changes in signal DN which is received from the phase frequency detector. This low signal is an inverted by inverter 323, so signal DN1 is high.

Since UP1 is low, PMOS transistor 331 is switched on, coupling the output of charge pump 330 to the current source. NMOS transistor 332 is likewise switched on because DN1 is high. This couples the output of charge pump 330 to the current drain. Because both transistor 331 and transistor 332 are switched on, the voltage at the voltage control node is at some intermediate level between the minimum (ground) and maximum (Vdd.) If the resistance of both transistors is the same, the intermediate voltage will be (Vdd-ground)/2.

It can be seen in FIG. 4 that the voltage level at the voltage control node, which is at a minimum level at time t4, increases until it reaches the intermediate voltage at approximately time t5. If the voltage were initially above this level, it would decrease until it reached the intermediate level. It can also be seen that the frequency of output signal PLL_OUT goes from a minimum value at time t4 to an intermediate frequency at time t5. The voltage at the voltage control node remains at the intermediate level (and signal PLL_OUT remains at the intermediate frequency) as long as both control signals remain high.

The embodiment described in connection with FIGS. 2 and 3 therefore provides a mechanism for obtaining sound information that characterizes the performance of the voltage controlled oscillator and the PLL circuit. It should be noted that this embodiment may also be used to control the initialization of the circuit at, for instance, power-on reset. As discussed in the background of the invention, it is desirable to prevent the voltage at the voltage control node (hence the frequency of the output signal) from being too high during initialization. In the same way the control signals are used above to determine the minimum and intermediate frequencies of the output signal in a test mode (i.e., by asserting DN_CTRL,) the control signals can be used during initialization to decrease the voltage at the voltage control node and thereby decrease the possible output signal frequency during initialization.

Figure 5:
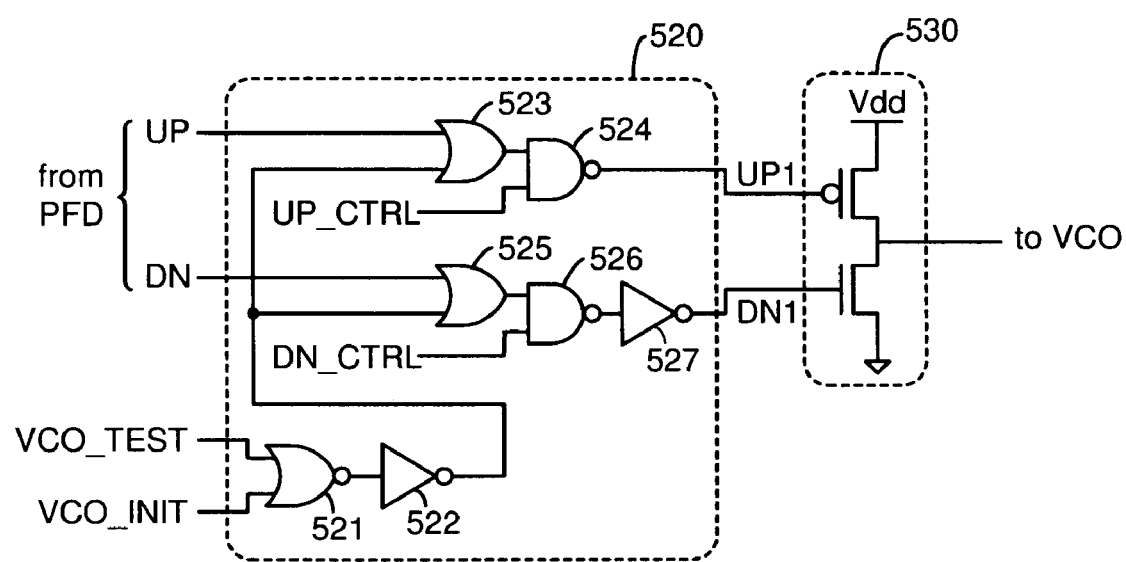
FIG. 5 is a diagram illustrating an alternative configuration of the control circuitry and charge pump of the PLL circuit of FIG. 3 that implements separate test and initialization signals in accordance with one embodiment.

Referring to FIG. 5, an alternative configuration of the control circuitry and charge pump of the PLL circuit that implements separate test and initialization signals is shown. It should be noted that control circuitry 520 and charge pump 530 are alternative, exemplary components that can be used in PLL circuit 200. It should be noted that charge pump 530 is identical to charge pump 330. The operation of charge pump 530 is therefore the same as described above with respect to charge pump 330. The difference between the embodiment of FIG. 5 and the embodiment of FIG. 3 lies within the structure of control circuitry 520. The following description will therefore focus on the structure and operation of control circuitry 520.

Control circuitry 520 consists of seven logic gates, including two inverters, two NAND gates, two OR gates and one NOR gate. These gates are configured to make use of the UP_CTRL and DN_CTRL signals, as well as two additional control signals, VCO_TEST and VCO_INIT. These signals are combined with the UP and DN signals received from the phase frequency detector to generate signals UP1 and DN1, which are provided to charge pump 530.

Control signals VCO_TEST and VCO_INIT are selectively asserted to cause the PLL circuit to operate in one of three modes: a normal operational mode; a test mode; and an initialization mode. In the normal operational mode, the UP and DN signals received from the phase frequency detector are passed through control circuitry 520 to charge pump 530 in the same manner as described above with respect to FIGS. 2 and 3. In the test mode, control signals UP_CTRL and DN_CTRL are used by control circuitry 520 to cause charge pump 530 to drive the voltage at the voltage control node to a selected (i.e., minimum, intermediate or maximum) voltage. In the initialization mode, control circuitry 520 causes charge pump 530 to drive the voltage to a level below the maximum (i.e., to a minimum or intermediate level.)

The PLL circuit is in the normal operational mode when both VCO_TEST and VCO_INIT are low. In this case, both inputs to NOR gate 521 are low, so the output of this gate is high. This signal is inverted by inverter 522, and is provided as an input to each of OR gates 523 and 525. Because this input is low, OR gates 523 and 525 simply pass through the other inputs, so that UP is provided at the output of OR gate 523 and DN is provided at the output of OR gate 525. The outputs of OR gates 523 and 525 are provided to NAND gates 524 and 526, respectively. Control signals UP_CTRL and DN_CTRL are also provided to NAND gates 524 and 526, respectively. In this embodiment, control signals UP_CTRL and DN_CTRL are both high in the normal operational mode, so NAND gates 524 and 526 simply serve to invert the UP and DN signals. The inverted UP signal is provided by NAND gate 524 to charge pump 530 as UP1. The inverted DN signal is invert it again by inverter 527 before being provided to charge pump 530 as DN1.

The PLL circuit enters the initialization mode when VCO_TEST is low and VCO_INIT is high. In this case, the output of NOR gate 521 is low. This signal is inverted by inverter 522, and the resulting high signal is provided as an input to OR gates 523 and 525. OR gates 523 and 525 therefore produce high signals at their respective outputs. These signals are provided as inputs to NAND gates 524 and 526. Because control signal UP_CTRL is low in the initialization mode, the output of NAND gate 524 is high. This switches off the PMOS transistor of charge pump 530, decoupling the output of the charge pump from the current source. Control signal DN_CTRL, on the other hand, is high, so the output of NAND gate 526 is low. This signal is inverted by inverter 527, so a high signal is applied to the gate of the NMOS transistor of charge pump 530. This switches the transistor on, coupling the output of charge pump 530 to the current drain. Since the output of charge pump 530 is coupled to the current drain and decoupled from the current source, the voltage at the voltage control node is pulled down. The voltage controlled oscillator therefore initializes at a low frequency in this embodiment, so the design of the PLL circuit components need not accommodate the possibility of high-frequency initialization.

The PLL circuit enters the test mode when VCO_TEST is high and VCO_INIT is low. In this case, the output of NOR gate 521 is low. This signal is inverted by inverter 522, and the resulting high signal is provided as an input to OR gates 523 and 525. OR gates 523 and 525 therefore produce high signals at their respective outputs. These signals are provided as inputs to NAND gates 524 and 526. NAND gates 524 and 526 also receive control signals UP_CTRL and DN_CTRL, respectively, as inputs. The values of these control inputs determine whether the voltage controlled oscillator of the PLL circuit is tested at minimum, intermediate or maximum levels. If UP_CTRL is low and DN_CTRL is high, both NAND gate 524 and inverter 527 produce high signals and their outputs. This causes charge pump 530 to drive the charge/voltage at the voltage control node to a minimum level, which in turn causes the voltage controlled oscillator to generate an output signal at a minimum frequency. If UP_CTRL is high and DN_CTRL is low, both NAND gate 524 and inverter 527 produce low signals and their outputs. This causes charge pump 530 to drive the charge/voltage at the voltage control node to a maximum level, which in turn causes the voltage controlled oscillator to generate an output signal at a maximum frequency. If both UP_CTRL and DN_CTRL are high, NAND gate 524 produces a low signal at its output, and inverter 527 produces a high signal. This switches on both of the transistors of charge pump 530 and causes the charge pump to drive the charge/voltage at the voltage control node to an intermediate level. This in turn causes the voltage controlled oscillator to generate an output signal at an intermediate frequency.

It should be noted that, in this embodiment, assertion of either the VCO_TEST signal or the VCO_INIT signal causes OR gates 523 and 525 to produce high signals at their outputs, regardless of the values of signals UP and DN, which are received from the phase frequency detector. As a result, neither signal UP1 nor signal DN1 has any pulses. Each of these signals is either high or low. As a result, the minimum and maximum voltages that can be achieved at the voltage control node may be closer to the power supply voltage and ground, respectively, than is possible in an embodiment such as depicted in FIG. 3, in which one input to the charge pump is constant and the other is pulsed.

If it is desired to achieve a higher maximum voltage and lower minimum voltage at the voltage control node without implementing the additional control signals VCO_TEST and VCO_INIT, a variation on the embodiment of FIG. 3 may be implemented. Such a variation is illustrated in FIG. 6.

Figure 6:
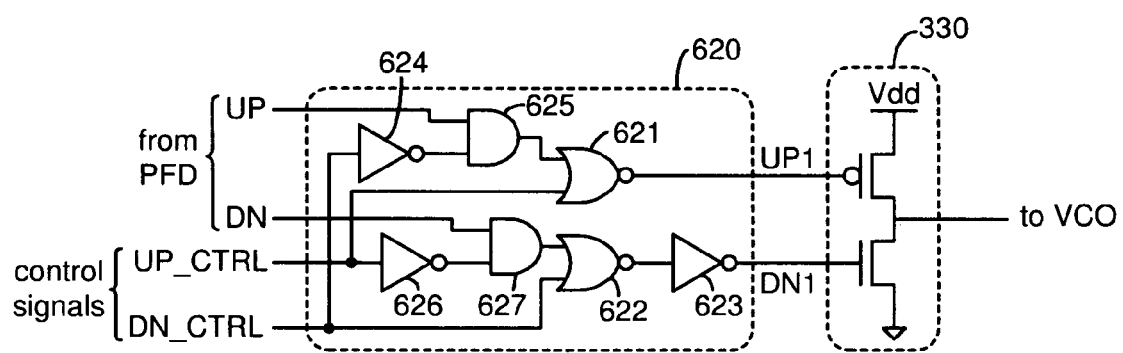
FIG. 6 is a diagram illustrating an alternative configuration of the control circuitry and charge pump of the PLL circuit of FIG. 3 that inhibits pulses from the phase frequency detector of the PLL circuit in accordance with one embodiment.

FIG. 6 depicts control circuitry 620 and charge pump 630. The structure of charge pump 630 is the same as that of charge pump 330, as described above in connection with FIG. 3. Control circuitry 620 receives the same input signals (UP, DN, UP_CTRL and DN_CTRL) as control circuitry 320 and provides the same output signals (UP1 and DN1,) but the structure is somewhat different. Control circuitry 620 includes a pair of NOR gates, 621 and 622, and an inverter 623 which are configured in essentially the same manner as NOR gates 321 and 322 and inverter 323 of control circuitry 320. Control circuitry 620, however, also includes a set of logic gates that prevent the pulses of the UP and DN signals from being passed through to charge pump 630.

In control circuitry 620, the UP_CTRL control signal in control circuitry 620 is provided as an input to NOR gate 621 in the same manner as shown in control circuitry 320. Similarly, the DN_CTRL control signal is provided as an input to NOR gate 622 in the same manner as shown in control circuitry 320. The other inputs to NOR gate 621 and 622, however, do not receive the UP and DN signals from the phase frequency detector. Instead, the UP signal is provided as an input to AND gate 625. The DN_CTRL control signal is inverted and provided as the other input to AND gate 625. The output of AND gate 625 is then provided as an input to NOR gate 621. Similarly, the DN signal received from the phase frequency detector is provided as an input to AND gate 627. The UP_CTRL control signal is inverted and provided as the other input to AND gate 627, and the output of AND gate 625 is provided as an input to NOR gate 622. The effect of these additional logic gates is to prevent the pulses of the UP signal from switching on the current source transistor when the minimum voltage/frequency is being tested, and to prevent the pulses of the DN signal from switching on the current drain transistor when the maximum voltage/frequency is being tested. In other words, these signals are held constant at a non-asserted level.

The embodiments described above are designed to enable the frequency response of the PLL circuit's voltage controlled oscillator to be tested at three points: the minimum voltage/frequency; the maximum voltage/frequency; and an intermediate voltage/frequency. Other embodiments may be designed to allow the testing of the voltage controlled oscillator characteristics at additional points. One such embodiment is illustrated in FIG. 7.

Figure 7:
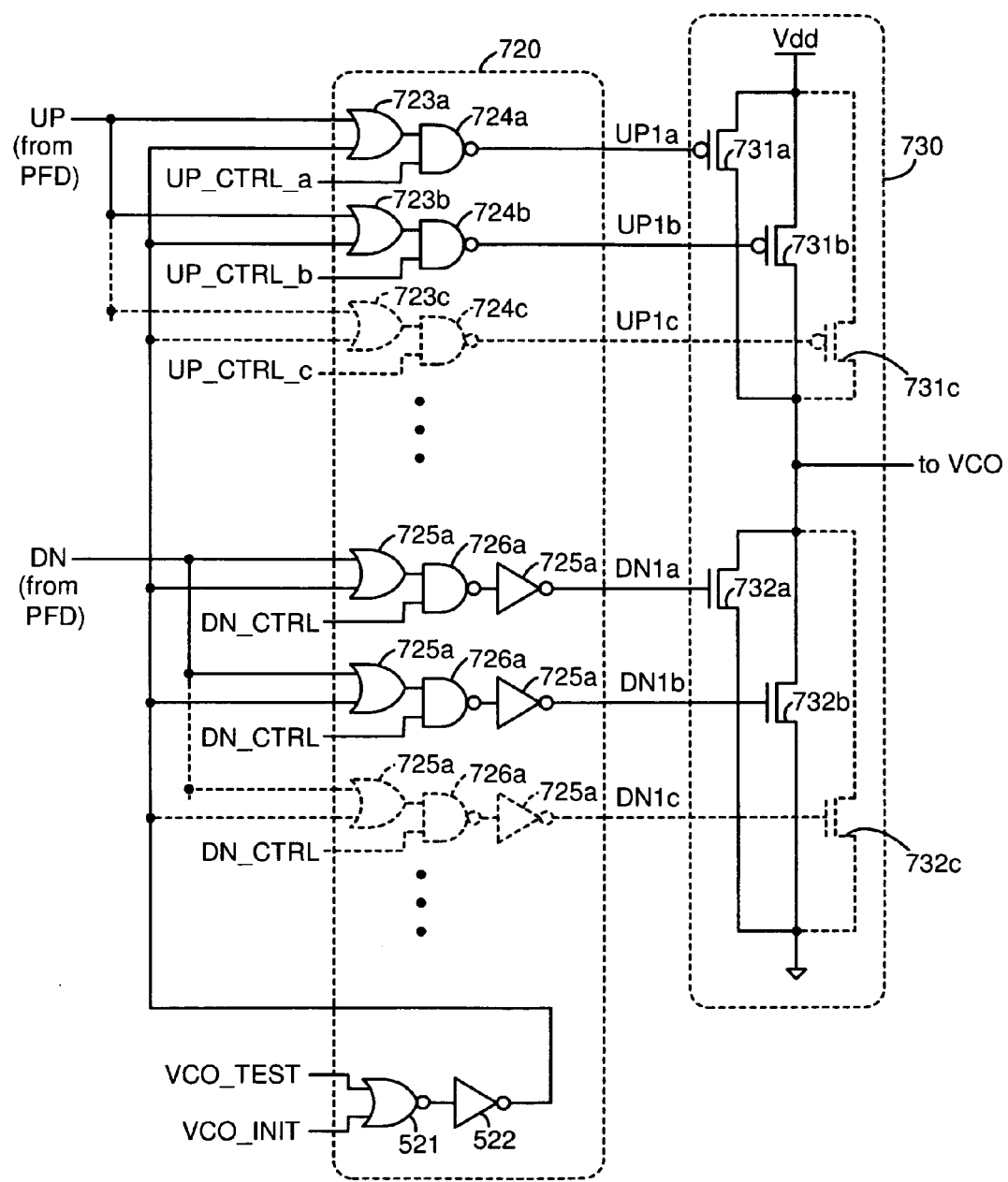
FIG. 7 is a diagram illustrating an alternative configuration of the control circuitry and charge pump of the PLL circuit of FIG. 3 that implements multiple sets of components to enable multiple intermediate test voltages in accordance with one embodiment.

Referring to FIG. 7, a diagram illustrating an alternative embodiment of the control circuitry and charge pump of a PLL circuit is shown. This design involves changes to both the control circuitry and the charge pump. The components of control circuitry 720 and charge pump 730 may be viewed as corresponding to the components of control circuitry 520 and charge pump 530, except that control circuitry 720 and charge pumps 730 include multiple sets of these components. For example, where control circuitry 520 includes an OR gate 523 and a NAND gate 524, control circuitry 720 includes a first set of logic gates (OR gate 723a and NAND gate 724a,) a second set of logic gates (OR gate 723b and NAND gate 724b,) and potentially additional sets of identical gates (723c and 724c, and so on,) each of which are identical. For the purposes of the following discussion, a "set" of components in the embodiments of FIG. 7 consists of the components that have the same lowercase letter following the reference number (e.g., 723a, 724a, 731a, . . . ) Components having the same reference number followed by different lowercase letters may be collectively referred to by the reference number alone. If a particular set of components is being discussed, a reference number without a following lowercase letter may be used to refer to the corresponding component in the set being discussed.

Each set of components in control circuitry 720 consists of a pair of OR gates, a pair of NAND gates, and an inverter. OR gate 723 receives the UP signal from the phase frequency detector, as well as the output of NOR gate 721 and inverter 722. The output of OR gate 723 is then input to NAND gate 724, along with a corresponding control signal (NAND gate 724a receives signal UP_CTRL_a, NAND gate 724b receives signal UP_CTRL_b, and so on.) The output of NAND gate 724 (UP1) is then provided as an input to charge pump 730, where it is used to switch a corresponding transistor (731) on and off. Control circuitry 720 also includes an OR gate 725 that receives the DN signal from the phase frequency detector and the signal from inverter 722 as inputs. The output of OR gate 725 is provided as an input to NAND gate 726, along with a corresponding control signal DN_CTRL. Again, the NAND gate (726) of each set receives a different control signal (i.e., gate 726a receives DN_CTRL_a, gate 726b receives DN_CTRL_b, and so on.) The output of NAND gate 726 is than the inverted and provided to charge pump 730 as signal DN1, which is used to switch a corresponding transistor (732) on and off.

As shown in FIG. 7, the signals generated by control circuitry 720 (UP1a, UP1b, . . . , DN1a, DN1b, . . . ) are used to control the transistors within charge pump 730 (731a, 731b, . . . , 732a, 732b, . . . ) that couple the output of the charge pump to the current source and current drain. It should be noted that transistors 731 are coupled in parallel between the current source and the output of charge pump 730. Similarly, transistors 732 are coupled in parallel between the current drain and the output of charge pump 730. This design allows a selected number of transistors to be switched on, thereby allowing an incrementally selectable amount of current to flow from the current source to the charge pump output, or from the charge pump output to the current drain. Whether each transistor in charge of 730 is turned on or not is determined by the state of the corresponding control signal. For example, if control signal UP_CTRL_a is high, transistor 731a will be switched on, and so on.

In this embodiment, the maximum voltage/frequency can be tested by switching on one of transistors 731 and switching off all of transistors 732. Similarly, the minimum voltage/frequency can be tested by switching on one of transistors 732 and switching off all of transistors 731. The middle voltage/frequency can be tested by switching on equal numbers of transistors 731 and 732 (e.g., one of transistors 731 and one of transistors 732.) Additional levels of voltages/frequencies can be tested by switching on unequal numbers of transistors 731 and 732 (e.g., one of transistors 731 and two of transistors 732.) For example, if there are two sets of components (a and b,) switching on one of transistors 731 and two of transistors 732 will result in a voltage at the voltage control node which is approximately Vdd/3. The voltages at the voltage control node that are selectable with two sets of components are shown in the table below. If additional sets of components are used, additional voltage levels can be achieved.

| VCO_TEST | VCO_INIT | UP_CTRL_a | UP_CTRL_b | DN_CTRL_a | DN_CTRL_b | Voltage at VC |
|---|---|---|---|---|---|---|
| 0 | 0 | 1 | 0/1 | 1 | 0/1 | Normal |
| 0 | 1 | 0 | 0 | 1 | 0/1 | Initialize (ground) |
| 1 | X | 0 | 0 | 1 | 0/1 | Minimum (ground) |
| 1 | X | 1 | 0/1 | 0 | 0 | Maximum (Vdd) |
| 1 | X | 1 | 0 | 1 | 0 | Vdd/2 |
| 1 | X | 1 | 1 | 1 | 0 | (⅔)*Vdd |
| 1 | X | 1 | 0 | 1 | 1 | (⅓)*Vdd |

It should be noted that the transistors are selectively switched on and off in the test mode (and potentially in the initialization mode.) In the normal operational mode, all of transistors 731 are switched on or off as a unit according to the UP signal received from the phase frequency detector, and all of transistors 732 are switched on or off as a unit according to the DN signal of the phase frequency detector.

It should also be noted that the particular configurations of the circuits described in connection with the foregoing embodiments are exemplary. The logic of the control circuitry in other embodiments may vary, as may the structure of the charge pump. The overall configuration of the PLL circuit may also vary in other embodiments.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in software (program instructions) executed by a processor, or in a combination of the two. Software may reside in RAM memory, flash memory, ROM memory, EPROM memory, EEPROM memory, registers, hard disk, a removable disk, a CD-ROM, or any other form of storage medium known in the art. An exemplary storage medium is coupled to a processor such the processor can read information from, and write information to, the storage medium. In the alternative, the storage medium may be integral to the processor. The processor and the storage medium may reside, for example, in an ASIC. The ASIC may reside in a user terminal. The processor and the storage medium may alternatively reside as discrete components in a user terminal or other device.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system implemented in a phase-locked loop (PLL) circuit, comprising;
   a charge pump configured to receive up and down signals and to maintain a voltage at an output of the charge pump based on the up and down signals;
   control circuitry coupled to the charge pump and configured to provide the up and down signals to the charge pump in either a first mode or a second mode;

wherein in the first mode, the control circuitry is configured to pass through signals received from a phase frequency detector as the up and down signals;

wherein in the second mode, the control circuitry is configured to override at least one of the signals received from the phase frequency detector to drive a voltage at an output of the charge pump to a selectable test voltage;

wherein the control circuitry is configured to receive one or more control signals and to enter one of the first and second modes based upon the control signals;

wherein the control signals include a test signal, an initialization signal, an up control signal and a down control signal;

wherein the control circuitry is configured to alternately enter the first and second modes based on the test and initialization signals; and wherein the test voltage is selectable from a plurality of possible voltages based on the up control signal and the down control signal.

2. The system of claim 1, further comprising the phase frequency detector.

3. The system of claim 2, further comprising a voltage controlled oscillator coupled to the output of the charge pump, wherein the voltage controlled oscillator is configured to generate a signal having a frequency corresponding to the voltage at the output of the charge pump.

4. The system of claim 3, further comprising a frequency divider coupled to the output of the voltage controlled oscillator, wherein the frequency divider is configured to receive the output signal of the voltage controlled oscillator and to generate a feedback signal having a frequency which is equal to the frequency of the output signal of the voltage controlled oscillator divided by a first factor, wherein the phase frequency detector is coupled to the frequency divider to receive the feedback signal and is configured to generate the signals provided to the control circuitry based upon comparison of the feedback signal with a reference signal.

5. The system of claim 1, wherein the control circuitry is configured to select the test voltage from a plurality of possible voltages based upon the control signals.

6. The system of claim 5, wherein the plurality of possible voltages include a minimum voltage, a maximum voltage and a mid-range voltage.

7. The system of claim 5, wherein the plurality of possible voltages include a minimum voltage, a maximum voltage and a plurality of intermediate voltages between the minimum and maximum voltages.

8. The system of claim 1, wherein the control signals include an up control signal and a down control signal, wherein when the up control signal is asserted, the control circuitry is configured to assert the up signal provided to the charge pump and wherein when the down control signal is asserted, the control circuitry is configured to assert the down signal provided to the charge pump.

9. The system of claim 1, wherein the control circuitry comprises a plurality of logic gates configured to combine the test signal and the initialization signal with the up control signal and the down control signal to generate the up and down signals, and the test signal and the initialization signal are selectively asserted to cause the PLL circuit to operate in one of a normal operational mode, a test mode, and an initialization mode.

10. A system implemented in a phase-locked loop (PLL) circuit, comprising:

a charge pump configured to receive up and down signals and to maintain a voltage at an output of the charge pump based on the up and down signals;

control circuitry coupled to the charge pump and configured to provide the up and down signals to the charge pump in either a first mode or a second mode;

wherein in the first mode, the control circuitry is configured to pass through signals received from a phase frequency detector as the up and down signals;

wherein in the second mode, the control circuitry is configured to override at least one of the signals received from the phase frequency detector to drive a voltage at an output of the charge pump to a selectable test voltage;

wherein the control circuitry and the charge pump include multiple sets of components, wherein each set includes
up control logic configured to receive one of the signals from the phase frequency detector and an up control signal and to generate an up signal to switch a corresponding current source transistor in the charge pump on and off
down control logic configured to receive one of the signals from the phase frequency detector and a down control signal and to generate a down signal to switch a corresponding current drain transistor in the charge pump on and off; and
wherein the control circuitry is configured to selectively switch the transistors of the charge pump on and off to drive the charge pump to generate multiple intermediate voltages at the output of the charge pump.

11. The system of claim 10, further comprising the phase frequency detector.

12. The system of claim 11, further comprising a voltage controlled oscillator coupled to the output of the charge pump, wherein the voltage controlled oscillator is configured to generate a signal having a frequency corresponding to the voltage at the output of the charge pump.

13. The system of claim 12, further comprising a frequency divider coupled to the output of the voltage controlled oscillator, wherein the frequency divider is configured to receive the output signal of the voltage controlled oscillator and to generate a feedback signal having a frequency which is equal to the frequency of the output signal of the voltage controlled oscillator divided by a first factor, wherein the phase frequency detector is coupled to the frequency divider to receive the feedback signal and is configured to generate the signals provided to the control circuitry based upon comparison of the feedback signal with a reference signal.

14. The system of claim 10, wherein the control circuitry is configured to receive one or more control signals, wherein the control circuitry is configured to enter one of the first and second modes based upon the control signals.

15. The system of claim 14, wherein the control circuitry is configured to select the test voltage from a plurality of possible voltages based upon the control signals.

16. The system of claim 15, wherein the plurality of possible voltages include a minimum voltage, a maximum voltage and a mid-range voltage.

17. The system of claim 15, wherein the plurality of possible voltages include a minimum voltage, a maximum voltage and a plurality of intermediate voltages between the minimum and maximum voltages.

18. The system of claim 14, wherein the control signals include an up control signal and a down control signal, wherein when the up control signal is asserted, the control circuitry is configured to assert the up signal provided to the charge pump and wherein when the down control signal is asserted, the control circuitry is configured to assert the down signal provided to the charge pump.

19. The system of claim 10, wherein the control circuitry comprises a plurality of logic gates configured to combine the test signal and the initialization signal with the up control signal and the down control signal to generate the up and down signals, and the test signal and the initialization signal are selectively asserted to cause the PLL circuit to operate in one of a normal operational mode, a test mode, and an initialization mode.

\* \* \* \* \*